US011982579B2

(12) United States Patent
Cobb et al.

(10) Patent No.: US 11,982,579 B2
(45) Date of Patent: May 14, 2024

(54) MEASUREMENT APPARATUS

(71) Applicant: PRAGMATIC PRINTING LTD., Sedgefield (GB)

(72) Inventors: Brian Hardy Cobb, Sedgefield (GB); Joao De Oliveira, Sedgefield (GB); Thomas Clark, Sedgefield (GB); Kenneth David Williamson, Sedgefield (GB)

(73) Assignee: PRAGMATIC PRINTING LTD., Sedgefield Durham (GB)

( * ) Notice: Subject to any disclaimer, the term of this patent is extended or adjusted under 35 U.S.C. 154(b) by 834 days.

(21) Appl. No.: 16/977,755

(22) PCT Filed: Mar. 5, 2019

(86) PCT No.: PCT/GB2019/050607
§ 371 (c)(1),
(2) Date: Sep. 2, 2020

(87) PCT Pub. No.: WO2019/171041
PCT Pub. Date: Sep. 12, 2019

(65) Prior Publication Data
US 2021/0003460 A1 Jan. 7, 2021

(30) Foreign Application Priority Data
Mar. 5, 2018 (GB) .................................. 1803527

(51) Int. Cl.
G01K 7/24 (2006.01)
G01D 5/12 (2006.01)
(Continued)

(52) U.S. Cl.
CPC .............. G01K 7/245 (2013.01); G01D 5/12 (2013.01); G01K 7/203 (2013.01); G01K 7/34 (2013.01);
(Continued)

(58) Field of Classification Search
CPC .......... G01K 7/245; G01K 7/34; G01K 7/203; G01L 1/144; G01L 1/2256; G01L 1/14;
(Continued)

(56) References Cited

U.S. PATENT DOCUMENTS 4,295,376 A * 10/1981 Bell ...................... G01L 9/0075
361/283.3
4,446,447 A * 5/1984 McNamara ............... G01L 9/12
331/65
(Continued)

FOREIGN PATENT DOCUMENTS

DE 2021811 A1 3/1971
EP 2940873 A1 11/2015
(Continued)

OTHER PUBLICATIONS

International Preliminary Report on Patentability for International Application No. PCT/GB2019/050607, dated Sep. 17, 2020.
(Continued)

Primary Examiner — Arnold M Kinkead
(74) Attorney, Agent, or Firm — Jason H. Vick; Sheridan Ross, PC

(57) ABSTRACT

Measurement apparatus, for generating a first output signal indicative of a measurand, comprises: a first oscillator circuit and a second oscillator circuit, each oscillator circuit being arranged to generate a respective oscillating output signal and comprising at least a respective first component having a property determining a respective output frequency of the respective oscillating output signal; a sensor for sensing said measurand, the sensor comprising said first component of the first oscillator circuit, said property of said first component of the first oscillator circuit being dependent upon said measurand; and circuitry arranged to receive said oscillating output signals and generate said first output signal, said first output signal being indicative of a number
(Continued)

of cycles of one of the first and second oscillating output signals in a time period determined by a period of the other of said first and second oscillating output signals.

24 Claims, 11 Drawing Sheets

(51) Int. Cl.
| | |
|---|---|
| *G01K 7/20* | (2006.01) |
| *G01K 7/34* | (2006.01) |
| *G01L 1/14* | (2006.01) |
| *G01L 1/22* | (2006.01) |
| *G01L 9/02* | (2006.01) |
| *G01N 27/12* | (2006.01) |
| *G01N 27/22* | (2006.01) |
| *H03K 3/03* | (2006.01) |
| *H03M 1/60* | (2006.01) |

(52) U.S. Cl.
CPC ............... *G01L 1/14* (2013.01); *G01L 1/144* (2013.01); *G01L 1/2256* (2013.01); *G01L 9/02* (2013.01); *G01N 27/121* (2013.01); *G01N 27/223* (2013.01); *H03K 3/03* (2013.01); *H03M 1/60* (2013.01)

(58) Field of Classification Search
CPC ........... G01L 9/02; G01L 9/12; G01N 27/121; G01N 27/223; H03M 1/60; G01D 5/12; H03K 3/03

USPC ........ 73/504.4, 504.04; 324/681, 76.62, 662, 324/600; 331/66, 167, 2

See application file for complete search history.

(56) References Cited

U.S. PATENT DOCUMENTS

| | | | | |
|---|---|---|---|---|
| 5,500,509 | A | * | 3/1996 | Vogt ........................ G01L 19/14 219/505 |
| 5,902,933 | A | | 5/1999 | Bingo et al. |
| 2009/0315749 | A1 | | 12/2009 | McCoy et al. |

FOREIGN PATENT DOCUMENTS

| | | |
|---|---|---|
| GB | 2248112 A | 3/1992 |
| WO | WO 01/96815 | 12/2001 |

OTHER PUBLICATIONS

International Search Report for International Application No. PCT/GB2019/050607, dated Jun. 14, 2019.
Written Opinion for International Application No. PCT/GB2019/050607, dated Jun. 14, 2019.
Search Report for Great Britain Patent Application No. 1803527.9, dated Aug. 31, 2018.

* cited by examiner

MEASUREMENT APPARATUS

CROSS-REFERENCE TO RELATED APPLICATIONS

This application is a national stage application under 35 U.S.C. 371 of PCT Application No. PCT/GB2019/050607 having an international filing date of 5 Mar. 2019, which designated the United States, which PCT application claimed the benefit of Great Britain Application No. 1803527.9, filed 5 Mar. 2018, each of which are incorporated herein by reference in their entirety.

FIELD OF THE INVENTION

The present invention relates to measurement apparatus for generating an output signal indicative of a measurand, i.e. a physical quantity or property which is to be measured.

BACKGROUND TO THE INVENTION

A wide variety of measurement apparatus for generating output signals indicative of various measurands is known. Such known apparatus includes apparatus arranged to generate digital output signals indicative of a physical quantity being measured, such as temperature, voltage, strain etc. Certain known measurement apparatus employs relatively complex circuitry, for example incorporating amplifiers and comparators, and in many cases is reliant on the availability of a stable power supply, such as a supply generating a stable supply voltage between voltage rails for powering the remainder of the measurement apparatus circuitry. For such apparatus, a technical challenge is how to generate a stable power supply in conditions where a number of environmental factors may work to make this difficult. In the absence of a stable power supply, the output of the measurement apparatus may be degraded, in the sense that it is less accurately indicative of the physical quantity being measured.

US2009/0315749A1 discloses measurement apparatus arranged to generate an output signal, in the form of a bit stream, indicative of a measurement generated by a sensor. That document describes the measurement apparatus as an analog to digital converter (ADC). The ADC includes a variable oscillator, a frequency divider, a clock circuit, and a counter. The variable oscillator is coupled to the sensor and is configured to generate an oscillating signal based on a measurement generated by the sensor. The frequency divider is coupled to the variable oscillator and configured to divide a frequency of the oscillating signal. The clock circuit is configured to generate a clock signal at a defined frequency. The counter is coupled to the frequency divider and to the clock and is configured to generate a bit stream representative of a first number of periods of the clock signal during a second number of periods of the divided oscillating signal. Thus, the measurement apparatus is relatively complex, and for accuracy relies on the regular period of the clock signal, which is either a clock signal extracted by a clock recovery circuit which recovers a carrier signal received at a device incorporating the ADC, or which is provided by a separate astable multi-vibrator circuit with fixed discrete components that provides an oscillation signal of known frequency. Thus, the described examples in US2009/0315749A1 relying on extraction of a clock signal are not suitable for applications where no external signal carrying a clock signal is available, and if the alternative teaching, to incorporate a separate astable multi-vibrator circuit with fixed discrete components, is taken then this results in an even more complicated apparatus, and one in which the accuracy of the output signal is affected by environmental factors that would cause the output frequency of that separate clock circuit to change, such as temperature changes affecting resistive components, capacitive components, etc.

SUMMARY OF THE INVENTION

It is an object of certain embodiments in the present invention to provide measurement apparatus that solves, at least partly, one or more of the problems associated with the prior art. Certain embodiments aim to provide simple and accurate measurement apparatus able to generate an output signal, such as a digital output signal, accurately indicative of a measurand, without requiring the provision of a stable voltage source. Certain embodiments aim to provide measurement apparatus providing an output signal that remains accurately indicative of a measurand, even when the components of the measurement apparatus are subjected to changes in environmental factors, such as temperature and/or humidity, for example, and/or when a supply voltage varies.

According to the present invention there is provided measurement apparatus for generating a first output signal (e.g. a digital output signal) indicative of a measurand, the apparatus comprising: a first oscillator circuit and a second oscillator circuit, each oscillator circuit being arranged to generate a respective oscillating output signal and comprising at least a respective first component (e.g. first timing component) having a property determining a respective output frequency of the respective oscillating output signal; a sensor for sensing said measurand, the sensor comprising said first component of the first oscillator circuit, said property of said first component of the first oscillator circuit being dependent upon said measurand; and circuitry arranged to receive said oscillating output signals and generate said first output signal, said first output signal being indicative of a number of cycles of one of the first and second oscillating output signals in a time period determined by a period of the other of said first and second oscillating output signals.

The first component may, in certain embodiments, be a resistor for example, having a resistance dependent upon temperature, and that resistance determining, at least in part, the respective output frequency. It will be appreciated that as the temperature of the resistor changes, so will its resistance, so will the output frequency of the first oscillator signal, and so will the first output signal. Advantageously, measurement apparatus in accordance with the present invention is thus able to provide a first output signal indicative of a measurand without needing amplifier or comparator circuitry, and without having to receive a stable clock signal.

In certain embodiments, said property of said first (timing) component of the second oscillator circuit is dependent upon said measurand. Thus, in such embodiments each of the first and second oscillator circuits may comprise a respective first timing component having a property dependent upon the measurand, that property determining, at least in part, the output frequency of the respective oscillator.

In certain embodiments, said property of said first component of the first oscillator circuit and said property of said first component of the second oscillator circuit have substantially the same dependence upon said measurand.

In certain embodiments, said first component of the first oscillator circuit and said first component of the second oscillator circuit have the same technical specification. Thus, the first oscillator circuit and the second oscillator circuit may be substantially identical, meaning that environmental factors affecting both equally may affect their output frequencies equally, and hence may have no effect on the output signal indicative of the measurand to which the sensor is exposed.

In certain embodiments, the dependence of said property of said first component of the first oscillator circuit upon said measurand is substantially different from the dependence of said property of said first component of the second oscillator circuit upon said measurand. By incorporating first components having different property dependencies on the measurand in the two oscillator circuits, the change in first output signal for a given change in the measurand may therefore be increased.

In certain embodiments, the dependence of said property of said first component of the first oscillator circuit upon said measurand is different from the dependence of said property of said first component of the second oscillator circuit upon said measurand over at least a range of values of said measurand.

In certain embodiments, the dependence of said property of said first component of the first oscillator circuit upon said measurand (e.g. dP/dM, where P is the value of the property, and M is the value of the measurand) is opposite in sign from the dependence of said property of said first component of the second oscillator circuit upon said measurand over said range of values of said measurand. For example, if each first component is a resistor, the resistor of the first oscillator circuit may be arranged to have a positive thermal coefficient of resistance over a range of temperatures to be measured, whereas the resistor of the second oscillator circuit may be arranged to have a negative thermal coefficient of resistance over that same range. Advantageously, therefore, the change in first output signal for a given change in temperature (the measurand in this example) may be increased. In such embodiments, it is particularly advantageous for the first components having properties differently, and oppositely, dependent on the measurand both to be incorporated in the sensor so as both to be exposed to the changes in the measurand.

In certain embodiments, said property of said first component of the second oscillator is independent of said measurand.

In certain embodiments, each oscillator circuit comprises a respective second component (e.g. second timing component) having a property determining said respective output frequency.

In certain embodiments, each oscillator circuit comprises at least a respective first inverter (e.g. first inverter circuit).

In certain embodiments, each oscillator circuit comprises only one respective inverter. Advantageously, the measurement apparatus may thus be implemented with less complex circuitry, involving fewer components, than prior art measurement circuits.

In certain embodiments, each oscillator circuit comprises a respective plurality of inverters.

In certain embodiments, the first and second oscillator circuits are arranged such that their oscillating output signals have the same frequency for a value of said measurand (e.g. a value within a selected, or desired, measurement range). Thus, in certain embodiments, the measurement apparatus may comprise nominally identical first and second oscillator circuits, which are therefore affected (in terms of output frequencies) in exactly the same way by changes in supply voltage and/or environmental conditions. The first and second oscillator circuits may be arranged such that their oscillating output signals have the same frequency when the first component of the first oscillator is exposed to the measurand having a value in the middle of the desired measurement range, for example. Thus, at this centre point the oscillating output signals may have the same frequency, and as the value of the measurand changes, the output frequencies diverge.

In certain embodiments, the first and second oscillators are arranged such that their oscillating output signals have different frequencies over a range (e.g. a selected, or desired, measurement range) of values of the measurand. Thus, the first and second oscillators may be deliberately arranged to have different output frequencies. In certain embodiments, the difference in frequencies is arranged to be so large that it is not necessary to incorporate any divider circuitry for dividing the output frequency of one of the oscillator circuits. Again, this enables the circuitry of the measurement apparatus, as a whole, to be substantially simplified compared with prior art arrangements.

In certain embodiments, the first and second oscillator circuits are arranged such that the output frequency of the second oscillator circuit is at least eight times higher than the output frequency of the first oscillator circuit over said range. In certain alternative embodiments, the first and second oscillator circuits are arranged such that the output frequency of the second oscillator circuit is at least eight times lower than the output frequency of the first oscillator circuit over said range.

In certain embodiments, said circuitry is arranged such that said first output signal indicates a number of cycles of the oscillating output signal of the second oscillator circuit in one period (or in half of one period) of the oscillating output signal of the first oscillator circuit. The "first output signal" in such examples may be the number of "fixed" (i.e. second) oscillator periods in one half of a divided sensing oscillator period, so may depend on the number of divisions of the sensing oscillator output. In certain embodiments, the first output signal may be arranged to be (or be indicative of) the number of fixed oscillator periods in one whole divided sensing oscillator period, e.g. by adding a flip-flop.

In certain embodiments, said circuitry comprises counting means (e.g. at least one counter, or counting circuit or module) arranged to count a number of cycles of the oscillating output signal of the second oscillator circuit in one period (or in half of one period) of the oscillating output signal of the first oscillator circuit, said first output signal being indicative of said count.

In certain embodiments, said circuitry comprises no frequency divider circuitry arranged to receive one of said oscillating output signals and generate a further output signal oscillating at a fraction of the frequency of said received one of the oscillating output signals.

In certain embodiments, said circuitry comprises divider circuitry arranged to receive one of said oscillating output signals and generate a further output signal oscillating at a fraction of the frequency of said received one of the oscillating output signals. Thus, divider circuitry may be employed both in embodiments in which the first and second oscillators oscillate at the same or similar frequencies, and in embodiments where their output frequencies are arranged to be substantially different over the measurement range. The divider circuitry may be arranged to divide the output frequency of either of the first and second oscillator circuits. In certain embodiments, the divider circuitry is arranged to divide the output of the first oscillator circuit, whose first timing component is incorporated in the sensor.

In certain embodiments, the divider circuitry is arranged to receive the oscillating output signal of the first oscillator circuit.

In certain embodiments, said circuitry arranged to receive said oscillating output signals is arranged such that said first output signal indicates a number of cycles of the oscillating output signal of the second oscillator circuit in one period (or in half of one period) of the oscillating further output signal.

In certain embodiments, said circuitry arranged to receive said oscillating output signals comprises counting means arranged to count a number of cycles of the oscillating output signal of the second oscillator circuit in one period (or in half of one period) of the oscillating further output signal, said first output signal being indicative of said count.

In certain embodiments, said divider circuitry comprises a plurality of divider stages.

In certain embodiments, the apparatus further comprises power supply circuitry arranged to power the first and second oscillator circuits and said circuitry arranged to receive said oscillating output signals. Advantageously, therefore, by powering the first and second oscillator circuits from the same power supply circuitry, variations in power supply may affect each equally, and so not contribute substantially to changes in the first output signal.

In certain embodiments, the power supply circuitry is arranged to generate a supply voltage between first and second supply rails, the first and second oscillator circuits being coupled to said supply rails.

In certain embodiments, the power supply circuitry comprises at least one antenna for receiving power wirelessly, and is arranged to generate said supply voltage from power received wirelessly by said at least one antenna. Thus, relatively simple (i.e. low complexity) power supply circuitry may be incorporated in embodiments of the invention, for generating the supply voltage from wirelessly received power, but as the first and second oscillator circuits are both coupled to the same supply rails then any variations in supply voltage over time will not substantially affect the first output signal, which can therefore remain accurately indicative of the measurand.

In certain embodiments, the apparatus comprises an integrated circuit coupled to said sensor.

In certain embodiments, the integrated circuit comprises said circuitry arranged to receive said oscillating output signals.

In certain embodiments, the integrated circuit comprises said power supply circuitry.

In certain embodiments, the integrated circuit comprises said second component of each of the first and second oscillator circuits.

In certain embodiments, the integrated circuit comprises each said inverter of each of the first and second oscillator circuits.

In certain embodiments, each said inverter of each of the first and second oscillator circuits is coupled between said supply rails.

In certain embodiments, the integrated circuit comprises said first component of the second oscillator.

Thus, the measurement apparatus may comprise an integrated circuit comprising a very large proportion of the electronic components of the measurement apparatus as a whole.

In certain embodiments, the apparatus further comprises a housing arranged to isolate, at least partially, the first component of the second oscillator circuit from said measurand.

In certain embodiments, the sensor comprises said first component of the second oscillator circuit. In such embodiments, it is particularly advantageous if the first component of the first oscillator circuit and the first component of the second oscillator circuit have corresponding properties differently, and preferably oppositely, dependent upon the measurand. For example, if those first components are resistors, then one may have a positive thermal coefficient of resistance whereas the other has a negative thermal coefficient of resistance over at least a range of values of the measurand. In alternative examples where the first components are capacitors, for example, then one may have a capacitance which increases with humidity in a particular humidity range, whereas the other has a capacitance which decreases with humidity over that same range.

In certain embodiments, the first oscillator circuit and the second oscillator circuit have the same circuit configuration as each other. In other words, the first oscillator circuit and second oscillator circuit may be nominally identical, such that changes in common factors, such as common supply voltages, may affect their output frequencies equally and so be largely rejected in the first output signal.

In certain embodiments, each of the first and second oscillator circuits is an RC oscillator circuit.

In certain embodiments, each said first component is a resistor and said property of the first component is resistance.

In certain embodiments, each said first component is a capacitor, and said property of the first component is capacitance.

In certain embodiments, each of the first and second oscillator circuits is an LC oscillator circuit.

In certain embodiments, said measurand is chemical or physical in nature, for example one of: temperature; humidity; strain; pressure; light; concentration.

In certain embodiments, at least one of the first and second oscillator circuits comprises at least one further component (e.g. a tuning component) having a property determining said respective output frequency, each said further component being connected in series or parallel with the respective first component.

In certain embodiments, said integrated circuit comprises at least one said further component.

In certain embodiments, said sensor comprises at least one said further component.

In certain embodiments, the first and second oscillator circuits may be provided by two current-controlled oscillators, one containing a first timing component in the form of a sensor current-generating device and the other containing a first timing component in the form of a reference current-generating device.

In certain embodiments, the first component of the first oscillator circuit is a current generating device arranged to generate a first output current dependent upon the measurand, and the first oscillator is a first current-controlled oscillator arranged to receive the first output current, the output frequency of the first oscillator circuit being dependent upon said first output current. In other words, said property of the first component of the first oscillator circuit may, in certain embodiments, be an electrical current.

In certain embodiments, the first component of the second oscillator circuit is a current generating device arranged to generate a second output current, and the second oscillator is a second current-controlled oscillator arranged to receive the second output current, the output frequency of the second oscillator circuit being dependent upon said second output current. In other words, said property of the first component of the second oscillator circuit may, in certain embodiments, be an electrical current.

In certain embodiments, said first output signal is a digital output signal. It will be appreciated, however, that in alternative embodiments the first output signal may take a variety of alternative forms. Thus, rather than being a digital or numerical output, the first output signal may be a graphic representation of the value of the measurand, or indeed have any form suitable for conveying information about the value of the measurand sensed by the sensor.

BRIEF DESCRIPTION OF THE DRAWINGS

Embodiments of the invention will now be described with reference to the accompanying drawings, in which.

DETAILED DESCRIPTION OF EMBODIMENTS

Figure 1:
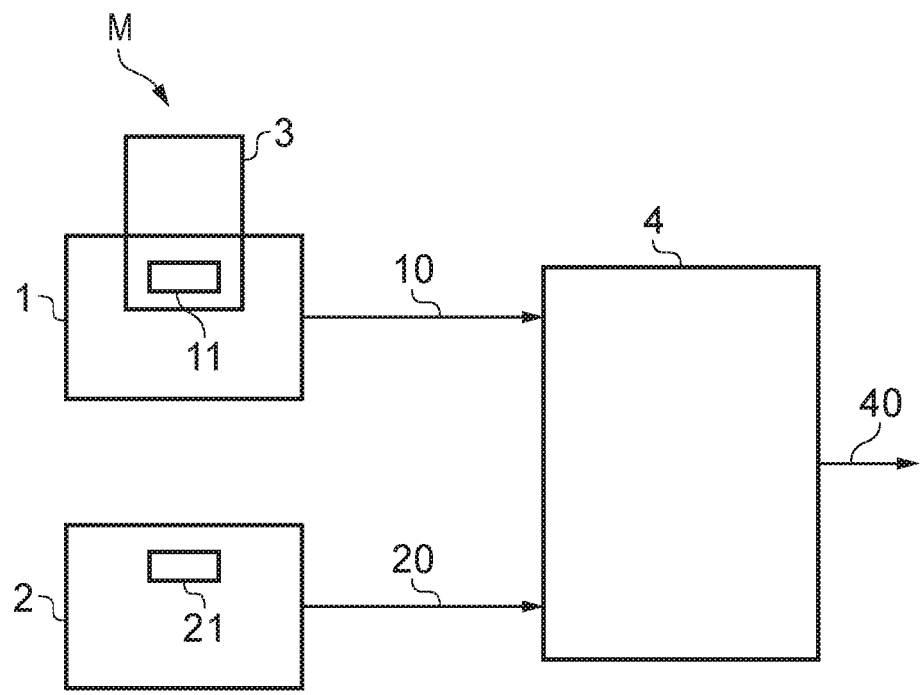
FIG. 1 is a schematic representation of measurement apparatus embodying the invention.

Referring now to FIG. 1, this shows measurement apparatus for generating a first output signal 40 indicative of a measurand M. The measurand may generally be any measurable physical quantity or property, but in this example is temperature. The apparatus comprises a first oscillator circuit 1 and a second oscillator circuit 2, each oscillator circuit being arranged to generate a respective oscillating output signal 10, 20, and comprising at least a respective first component (which may also be referred to as a first timing component 11, 21 having a property determining a respective output frequency of the respective oscillating output signal 10, 20. In this example the first component 11 of the first oscillator 1 is a resistor, whose resistance determines the output frequency of the first oscillator output signal 10. The first component 21 of the second oscillator is also a resistor, whose resistance determines the frequency of the oscillating output signal 20. The apparatus also comprises a sensor 3 for sensing the measurand, the sensor comprising the first component 11 of the first oscillator circuit. In this example, the resistance of the first component 11 is dependent upon temperature, which the sensor 3 senses. The apparatus also comprises circuitry 4 arranged to receive the oscillating output signals 10, 20 and generate the first output signal 40, that signal 40 being indicative of the number of cycles of one of the first and second oscillating output signals 10, 20 in a time period determined by a period of the other of the first and second oscillating output signals 10, 20. Thus, in this example the sensor 3 comprises just one of the first components, namely the first timing component 11 of the first oscillator circuit. Sensor 3 may be a part of the same device as, or a separate device from, that in which the remaining components of oscillator circuits 1 and 2 are located. For example first timing component 11 of the first oscillator circuit and first timing component 21 of the second oscillator circuit may both be located in a sensing integrated circuit (sensing IC). Taking the above example, first components 11 and 21 may both be resistors in the same sensing IC, with the resistance of at least first component 11 dependent upon its temperature. For example first component 11 may be a thermistor. If the resistance of first component 21 is not dependent, or depends differently from that of first component 11, on temperature, then the difference in the frequencies of oscillating output signals 10 and 20 may be related to the temperature of both first timing components.

Figure 2:
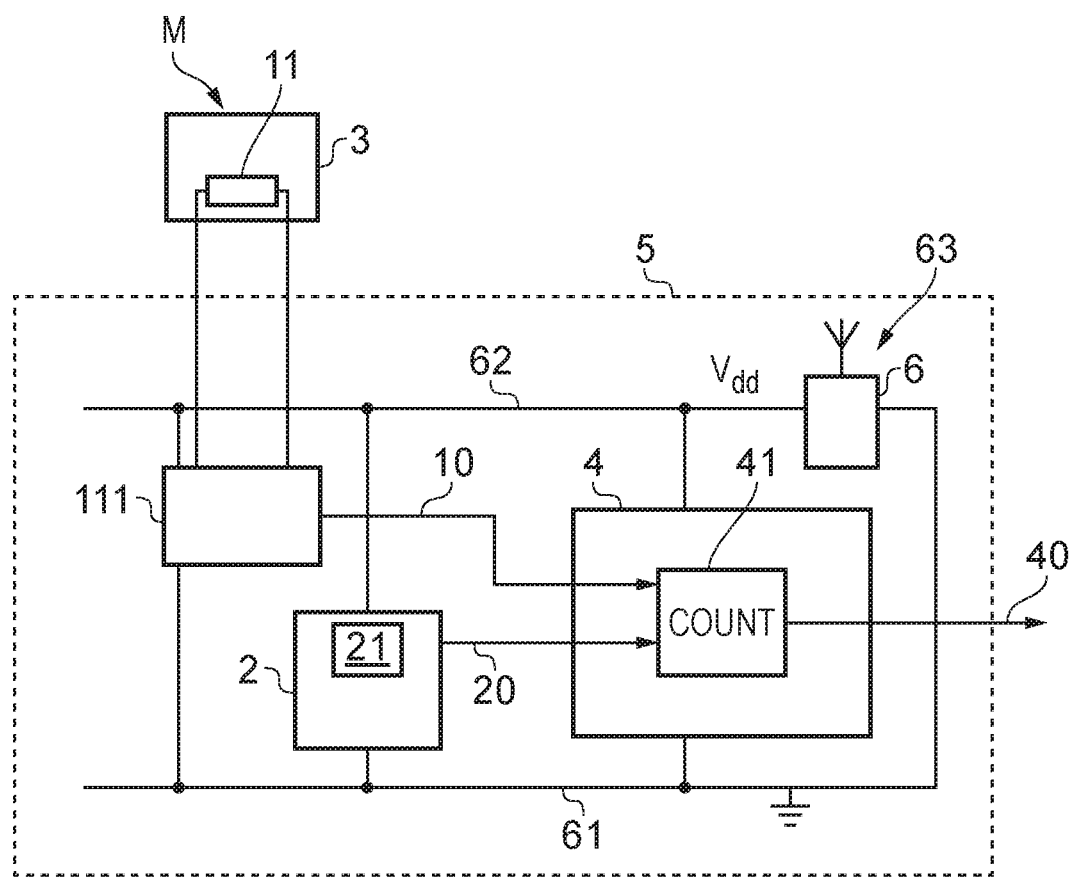
FIG. 2 is a schematic representation of another embodiment of the invention.

Referring now to FIG. 2, this shows another embodiment. Here, the sensor 3 again comprises a first timing component 11 of the first oscillator circuit, the remainder 111 of the first oscillator circuit (i.e. its components with the exception of the first component 11 and connections to the sensor) being provided on an integrated circuit 5. Thus, the integrated circuit comprises all components of the first oscillating circuit, except for the first component 11. The integrated circuit also comprises the second oscillator circuit 2, including its first timing component 21, and the circuitry 4 arranged to generate the first output signal 40 from the output signals 10, 20 of the two oscillator circuits. The integrated circuit also comprises power supply circuitry 6, which comprises an antenna 63, and is arranged to generate a supply voltage Vdd between first and second supply rails 61, 62 from power received wirelessly by the antenna 63. In alternative embodiments, the antenna 63 may be external to the integrated circuit 5, but coupled to the remainder of the power supply circuitry 6. The power supply circuitry powers the first and second oscillator circuits and the output signal generating circuitry 4, each of which is coupled between the supply rails 61, 62. Thus, any variation in Vdd affects the first and second oscillators equally, helping the output signal 40 be largely independent of variations in Vdd. In this example, only the first component 11 of the first oscillator circuit is external to the integrated circuit (i.e. off-chip). In this example, the timing components 11, 21 of the first and second oscillators are arranged such that over a desired range of the measurand M to be measured, the output frequency of the second oscillator's output signal 20 is much higher than the output frequency of the output 10 of the first oscillator. In this example, the output frequency of signal 20 is at least eight times that of output signal 10, and in other embodiments the ratio in output frequencies may be even greater, for example with signal 20 being at least one hundred times the frequency of signal 10. Thus, in this example there is no divider circuitry arranged to divide down the output signal 10, 20 of either of the first and second oscillators. Instead, the output signal generating circuitry 4 includes counting means 41 arranged to receive the first oscillating output signal 10 and the second, higher frequency, oscillating output signal 20, and generates the first output signal 40 which is indicative of the ratio of the frequencies of those two oscillating output signals 10, 20 which in turn is indicative of the temperature of the sensor 3, and hence resistance of the first component 11. In particular, the output signal 40 is indicative of the number of cycles of output signal 20 in one cycle (or in half of one cycle) of output signal 10. It will be appreciated that, the higher the output frequency of signal 20, relative to signal 10, the better the resolution of the first output signal 40 for indicating the sensed value of the measurand M.

Figure 3:
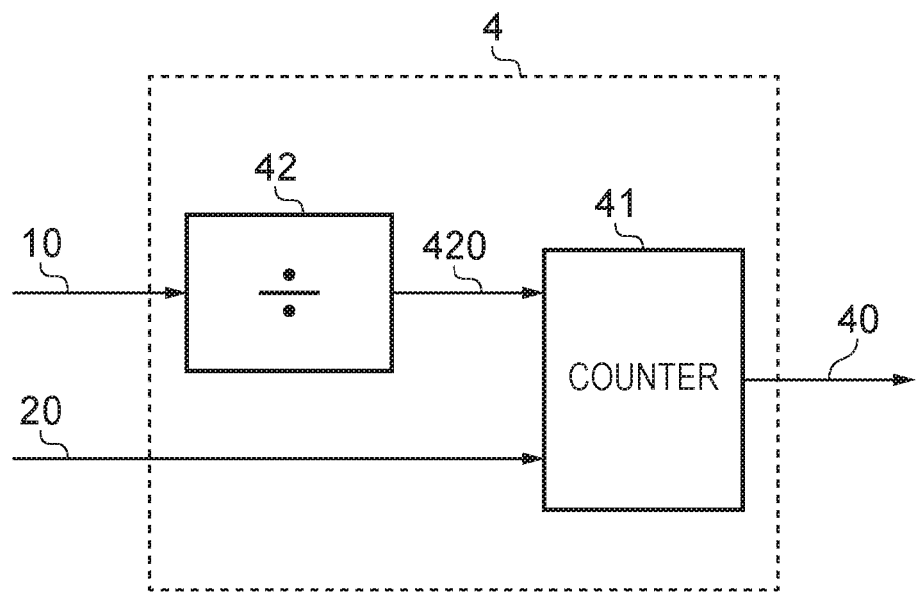
FIG. 3 illustrates circuitry for incorporation in certain embodiments of the invention.

Referring now to FIG. 3, this shows output signal generating circuitry 4 suitable for use in alternative embodiments of the invention. Here, that circuitry 4 comprises divider circuitry 42 (which may also be referred to as a frequency divider), arranged to receive the oscillating output signal of one of the first and second oscillators and generate a further oscillating output signal 420 oscillating at a fraction of the frequency of the received signal. In this example, the divider circuitry 42 is shown receiving the first oscillator output signal 10. In alternative embodiments, the divider circuitry 42 may be arranged to receive the output signal 20 of the second oscillator circuit rather than that of the first. The circuitry 4 also comprises a counter or counting means 41 arranged to receive the further oscillating output signal 420 and the undivided oscillating output signal 20, and generate the first output signal 40 indicative of a number of cycles of signal 20 in one period (or in half of one period) of signal 420. It will be appreciated that circuitry 4 as shown in FIG. 3 may be employed in embodiments of the invention where the first and second oscillators are arranged to have substantially the same output frequency for at least one value of the measurand M. Advantageously, the two oscillator circuits may therefore be arranged to be substantially identical to one another, and yet good resolution may be achieved by sufficiently dividing down one of the oscillating output signals to be used to determine a counting interval in which periods of the other oscillating output signal are counted. However, the circuitry shown in FIG. 3 may also be used in embodiments where the frequencies of the oscillating output signals 10, 20 are substantially different from one another, over even an entire range of values of the measurand M to be measured.

Figure 4:
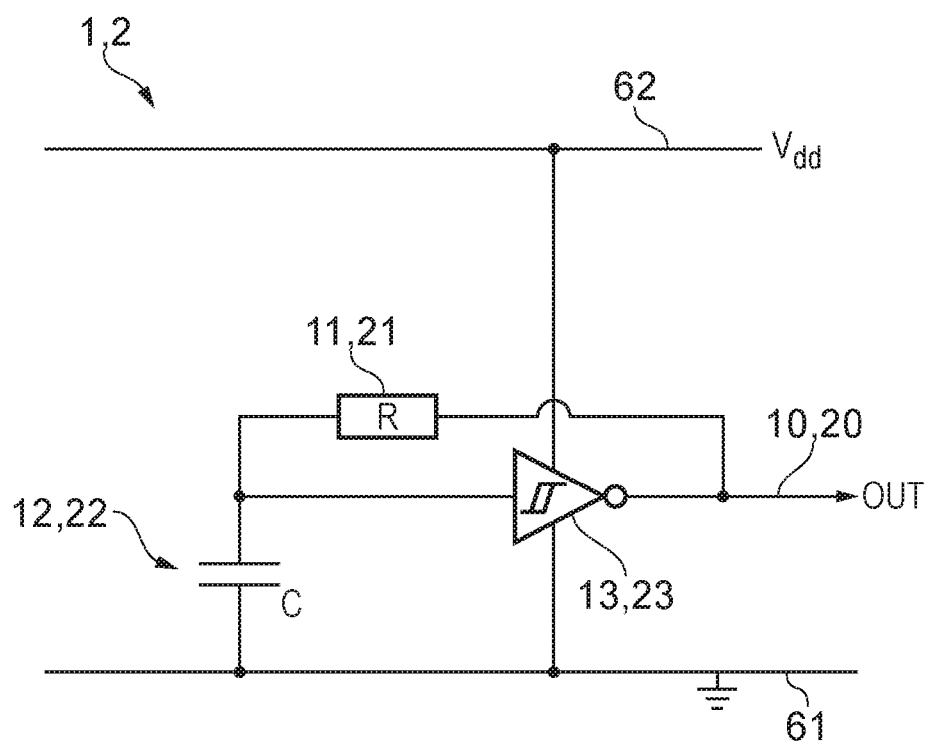
FIG. 4 illustrates an RC oscillator circuit used in certain embodiments of the invention.
Figure 4B:
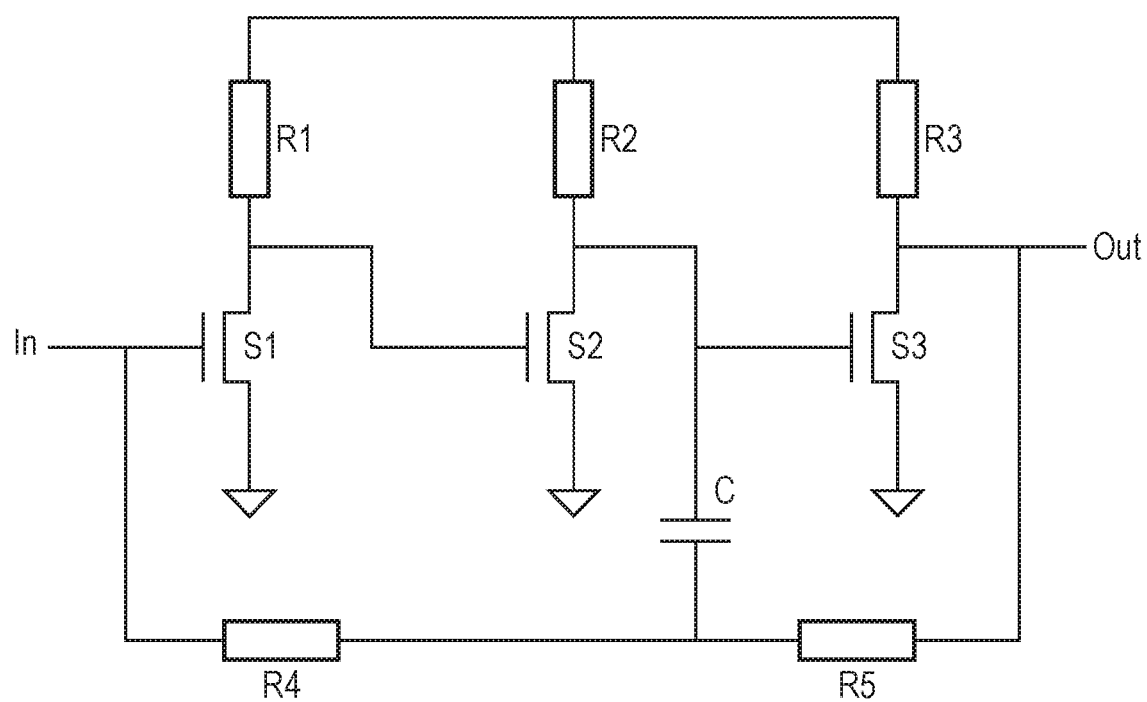
FIG. 4(b) illustrates another oscillator circuit suitable for use in certain embodiments of the invention.

Referring now to FIG. 4, this shows a simple RC oscillator circuit suitable for use as the first oscillator circuit 1 or second oscillator circuit 2 in embodiments of the invention. The RC oscillator comprises just a single invertor (or invertor circuit) 13, 23 connected between (i.e. powered by, or from) supply rails 62 and 61. The oscillator circuit comprises a first timing component in the form of a resistor R 11, 21, connected between the output node or terminal of the oscillator and the input of the inverter, and a second timing component in the form of a capacitor C 12, 22 connected between the inverter input and ground supply rail 61. It will be appreciated that the circuit generates an oscillating output signal 10, 20 as capacitor C alternately charges and then discharges. The output frequency is determined by both the resistance of resistor 11, 21 and the capacitance of capacitor 12, 22. Other oscillator types may be used, for example a three stage RC oscillator as illustrated in FIG. 4(b). Switches (transistors) S1, S2 and S3 and respective resistors R1, R2 and R3 form a three stage oscillator. Feedback is provided by the network of resistors R4 and R5 and capacitor C, the values of which affect the clock output frequency.

In other oscillator types a timing component may take the form of a current generating device that determines the oscillating frequency. For example the current may be applied to a capacitor to integrate the current, such that, for a constant current, the voltage between the capacitor plates varies linearly in time. By repeatedly charging (and/or discharging) the capacitor with the same current, between two fixed voltages, an oscillation is generated at a frequency that depends on, e.g. is proportional to, the current amplitude. Such an oscillator includes what may be termed a single slope integrator, however many other examples of current-controlled oscillators are known, and they may be used in embodiments of the invention. For example, some sensors do not comprise a timing component in the form of a resistor or a capacitor whose value is dependent on the measurand M to which the sensor is exposed. An example of such sensors is an electrochemical sensor device generating a current whose value is dependent on the measurand M, e.g. a concentration of a chemical. Measurement of the current by inserting a resistor in the current path and measuring the voltage across the resistor may disturb the sensing circuit that generates the current, for example due to the varying voltage across the resistor. In some cases this approach may provide only a very small voltage that is difficult to measure. It is known to measure a current by firstly mirroring the current, using a current mirror circuit, and then applying the mirrored current to an oscillator. So changes in a measurand M that cause changes in a sensor current may be measured by mirroring the current, applying the mirrored current to an oscillator and measuring the change in oscillation frequency. The measurement apparatus of certain aspects and/or embodiments of the present invention may therefore comprise two current-controlled oscillators, one containing a first timing component in the form of a sensor current-generating device and the other containing a first timing component in the form of a reference current-generating device.

Figure 5:
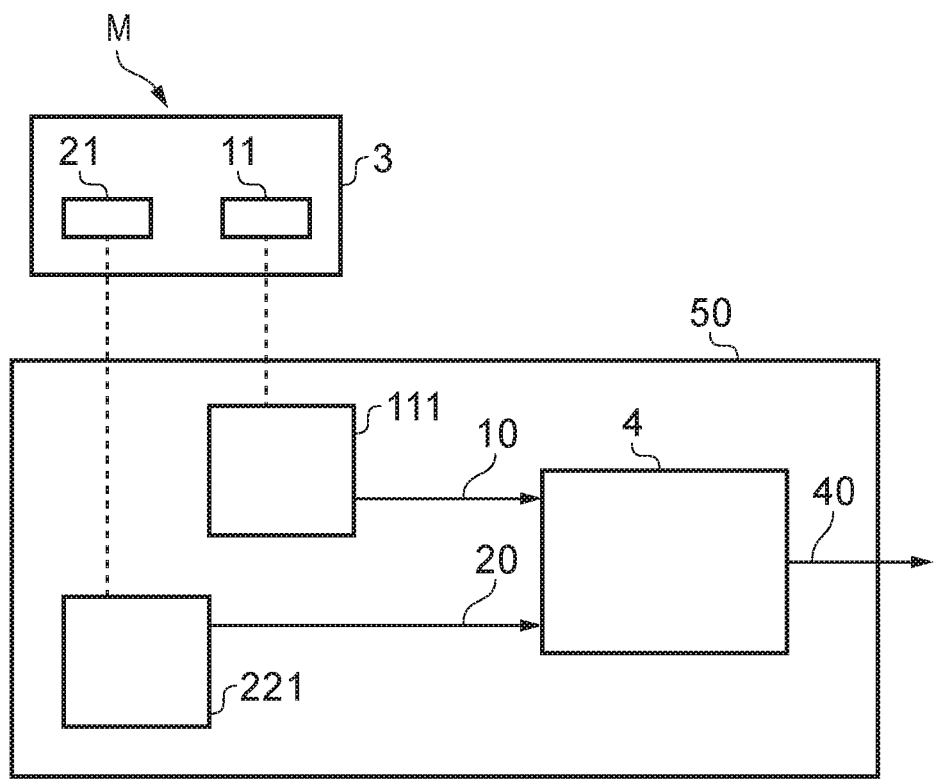
FIG. 5 illustrates measurement apparatus in accordance with another embodiment of the invention.

Referring now to FIG. 5, in this embodiment the sensor 3 comprises the first timing component 11 of the first oscillator circuit and the first timing component 21 of the second oscillator circuit. These first components 11, 21 are arranged to have properties which are differently dependent upon the measurand M to which the sensor 3 is exposed. For example, in certain embodiments where the first components 11, 21 are resistors, one resistor may be arranged to have a positive temperature coefficient of resistance for a certain range of values of temperature, whereas the other has a negative temperature coefficient of resistance in that range. In alternative embodiments, where the first components 11, 21 are capacitors, one may be arranged to have a capacitance which increases with the measurand (for example humidity), whereas the other has a capacitance which decreases with that measurand, over at least a range of values. The remainder (i.e. the components apart from the first component 11) of the first oscillator circuit 111 and the remainder of the second oscillator circuit 221 are each contained within a housing 50, which also houses the circuitry 4 arranged to generate the first output signal 40 from the first and second oscillating signals 10, 20. The housing 50 serves to isolate, at least in part, the remaining components of the first and second oscillators and the output circuitry from the changes in the measurand M to which the sensor 3 is deliberately exposed. The first components 11, 21 are coupled to their respective oscillator circuits, and that coupling is indicated generally by the broken lines in the figure. It will be appreciated that a variety of forms of coupling may be employed in embodiments of the invention, for example using wired connections, wireless connections, optical connections or any other suitable means.

Figure 6:
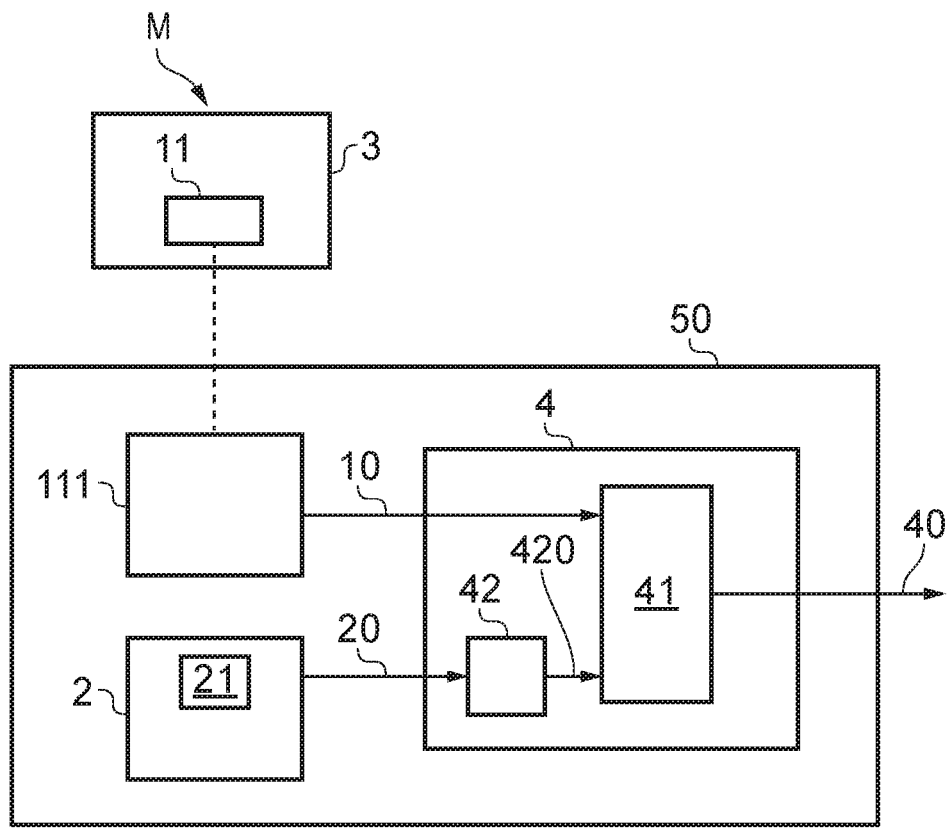
FIG. 6 illustrates measurement apparatus in accordance with another embodiment of the invention.

Referring now to FIG. 6, this shows another embodiment of the invention. Here the sensor 3 comprises just the first component 11 of the first oscillator circuit. The output signal generating circuitry 4 comprises divider circuitry 42 which is arranged to divide down the output signal 20 from the second oscillator 2, generating a divided signal 420. The counting means 41 is arranged to generate the first output signal 40 such that signal 40 is indicative of a number of cycles of output signal 10 in one period, or in half of one period, of divided oscillating signal 420. In this example the first timing component 21 of the second oscillator is housed, together with the rest of the first and second oscillator circuits and the output signal generating circuit 4, within a housing 40, which serves to isolate, at least partly, first component 21 from changes in the measurand M to which the sensor 3 is exposed.

Figure 7:
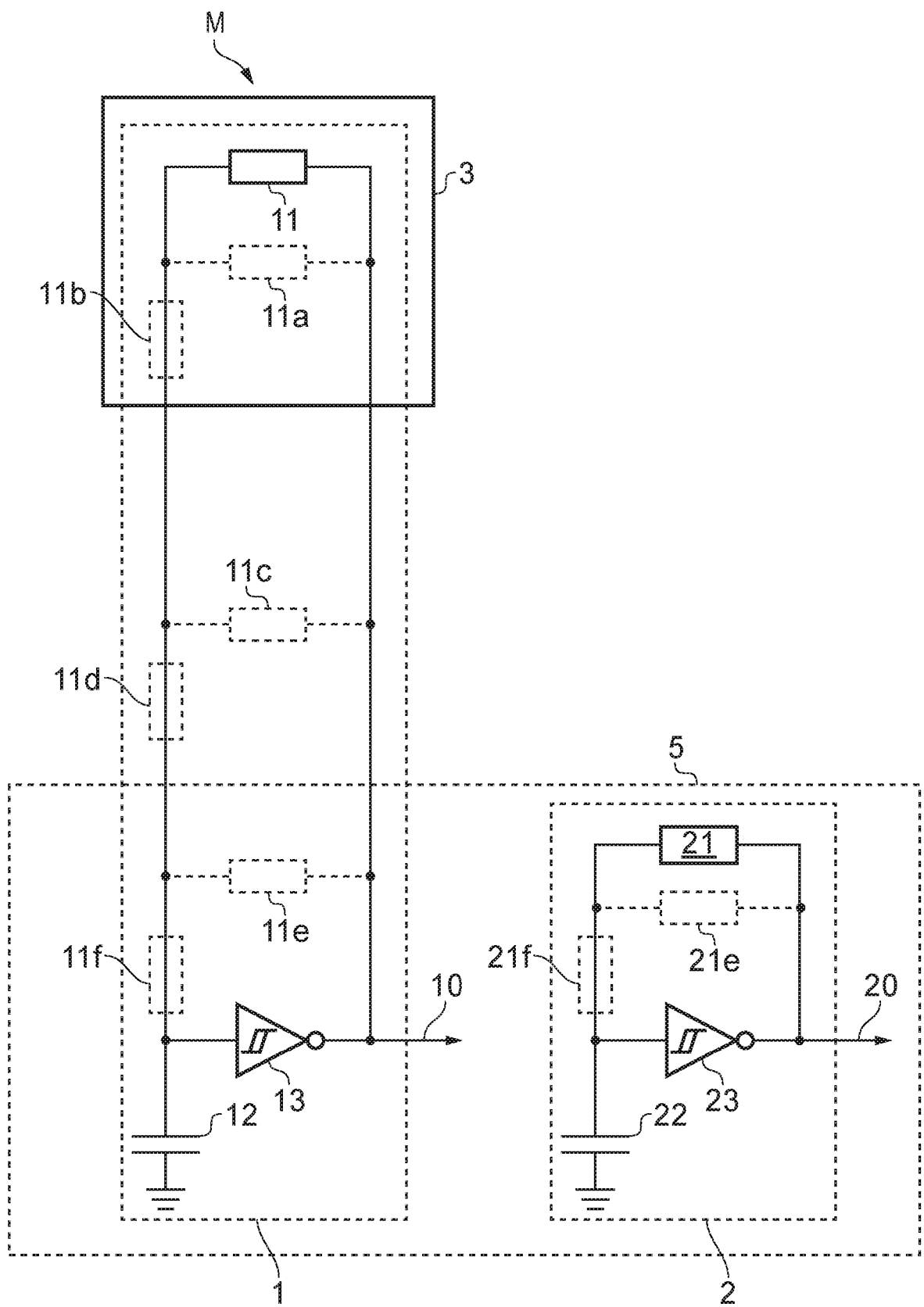
FIG. 7 illustrates part of measurement apparatus in accordance with an embodiment of the invention.

Referring now to FIG. 7, this illustrates the first and second oscillating circuits and sensor 3 of another embodiment of the present invention. In this example, each of the first and second oscillator circuits 1, 2 is an RC oscillator circuit comprising a single respective inverter (or inverter circuit or inverter stage) 13, 23. The apparatus includes an integrated circuit 5 which comprises all components of the second oscillator 2, together with the inverter 13 and second timing component 12 of the first oscillator circuit. The sensor 3 is external to the integrated circuit 5 and comprises the first timing component 11 of the first oscillated circuit of the first oscillator circuit, that first timing component being a resistor in this example. Changes in the measurand M, for example temperature to which the sensor is exposed result in changes in the resistance of resistor 11, which in turn alters the output frequency of the oscillating output signal 10 of the first oscillator, but not that of the second oscillator. Optionally, the circuitry may comprise one or more tuning components in the form of one or more additional resistors connected in series or in parallel with the first component 11 in the first oscillator circuit to adjust the frequency of output signal 10. These optional tuning components are labelled as 11a-11f in the figure and it will be appreciated that they may be comprised in the sensor 3, in the integrated circuit 5, and/or be located elsewhere, i.e. not in the sensor 3 or integrated circuit 5. Thus, one or more tuning components may be incorporated in the first oscillator circuit to adjust its output signal frequency 10, and may be on-chip, off-chip, or within the sensor 3.

Figure 8:
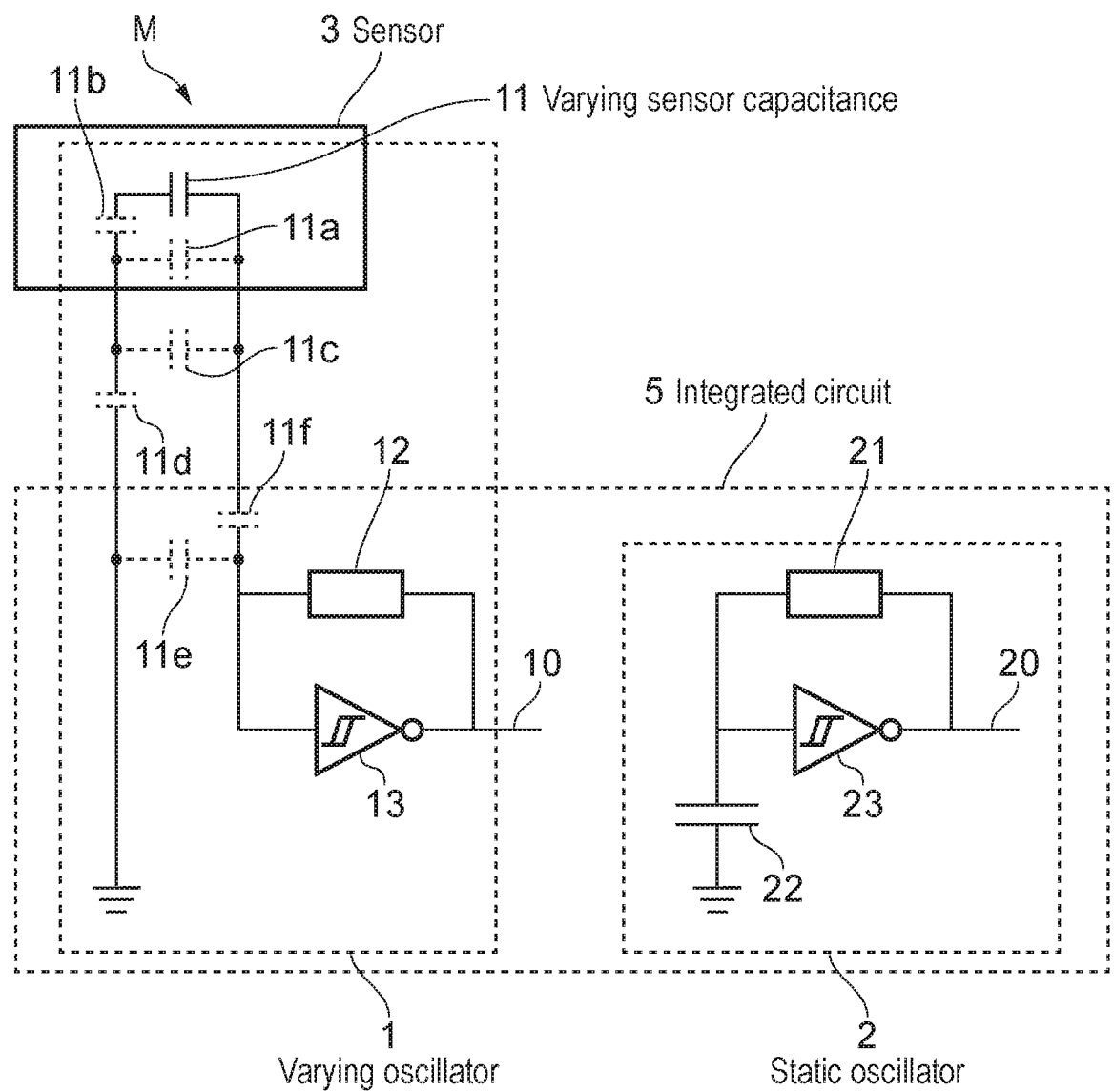
FIG. 8 illustrates part of measurement apparatus in accordance with another embodiment of the invention.

Referring now to FIG. 8, this shows part of another embodiment of the invention. Here, the first and second oscillator circuits 1, 2 are again RC oscillator circuits, each comprising a single respective inverter 13, 23. In this example the first timing component 11 of the first oscillator circuit incorporated in the sensor 3 is a capacitor, having a capacitance which is dependent upon the value of a measurand to which the sensor is exposed. Like the embodiments of FIG. 7, an integrated circuit 5 comprises the entirety of the second oscillator 2 and the inverter 13 and second timing component 12 of the first oscillator 1. Optional locations for tuning components 11a-11f are shown on the figure, those locations including on-chip locations, off-chip locations, and locations within the sensor 3.

Figure 9:
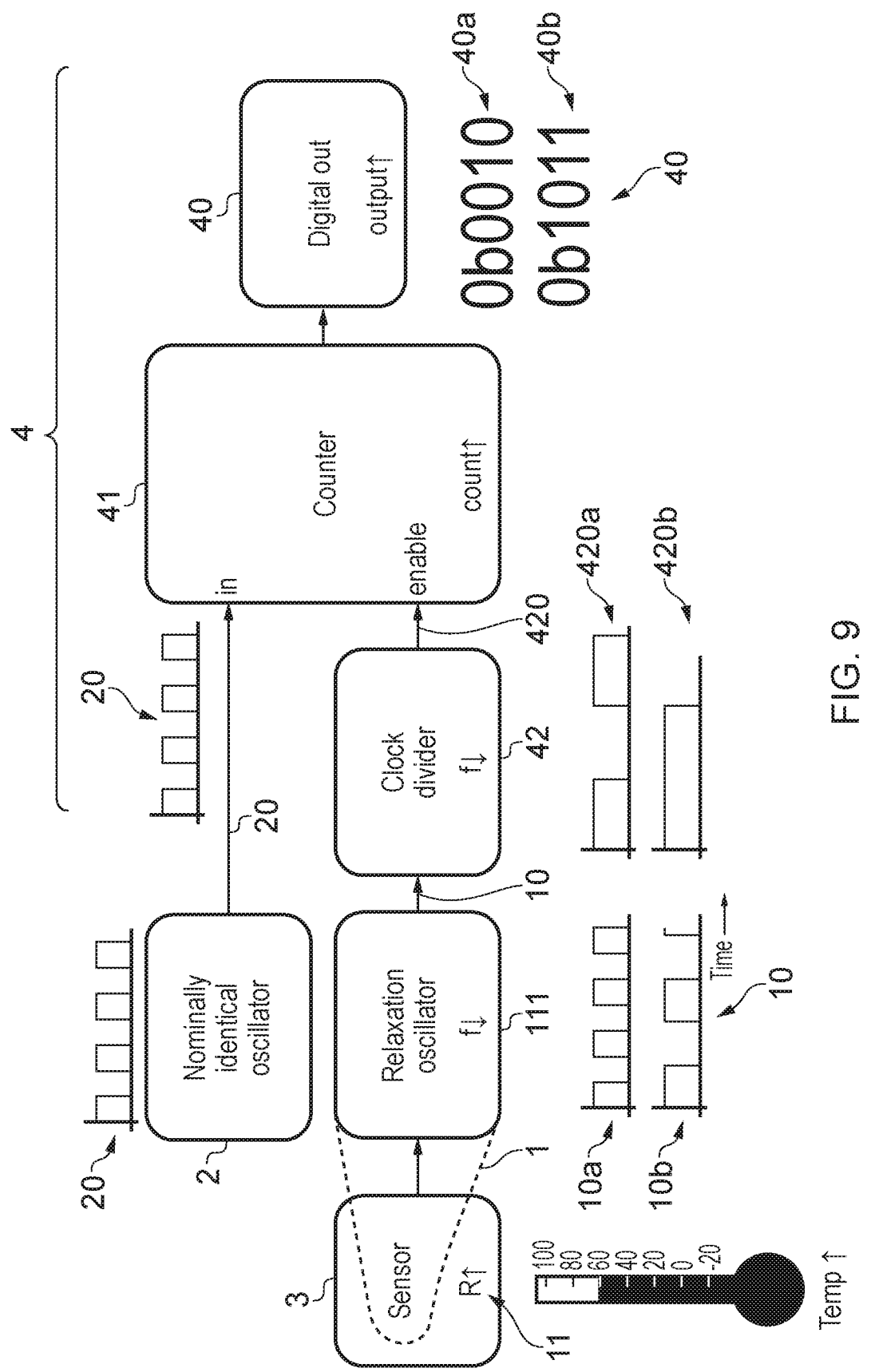
FIG. 9 illustrates yet another measurement apparatus in accordance with an embodiment of the invention.

Referring now to FIG. 9, this illustrates measurement apparatus in accordance with another embodiment of the invention. This measurement apparatus is a twin oscillator measurement circuit, the circuit converts a change in capacitance or change in resistance of a sensor (resulting from changes in temperature, humidity, or other factors etc) to a proportional digital output 40. The apparatus comprises two oscillators, a first oscillator in the form of a relaxation oscillator and a second, internal oscillator 2 which is nominally identical to the first oscillator 1. Each oscillator is an RC oscillator. For the first oscillator, a change in C and/or R of its respective timing components results in a proportional change in output frequency of its oscillating output signal 10. The second oscillator 2 generates a substantially fixed, known frequency, and the two frequencies are compared using a frequency counter 41. The counter outputs a digital output signal 40 indicative of the ratio of the periods of the two oscillator output signals 10, 20. In the example illustrated in FIG. 9, the apparatus comprises a sensor 3 which comprises a first timing component 11 of the first oscillator 1, that first timing component 11 being a resistor, although in alternative embodiments it may be a capacitor for example.

The two oscillators 1, 2 used in the apparatus of FIG. 9 are schematically identical, with the only difference between them coming from the sensor 3. For each oscillator, the oscillator output frequency is affected by supply voltage, transistor switching threshold, RC values, etc. However, substantially identical oscillators will show the same change in output frequency for a given change in voltage, temperature, or other common factor, and the ratio between their frequencies remains constant, resulting in a stable output from the system, i.e. an output signal being accurately indicative of the physical quantity being measured (in this example temperature, but other physical quantities in alternative embodiments), and not being substantially affected by changes in those common factors. In certain embodiments, the R/C value of the "fixed" oscillator (i.e. the second oscillator 2) should equal that of the sensor oscillator 1 at the system's central operating point for maximum accuracy over the system's input range. In other words, if it is desired to measure temperate over a range T1 to T2, then the timing components of the two oscillators should be arranged such that their oscillating output signals 10, 20 have the same frequency when the sensor is exposed to temperature (T2−T1)÷2.

Advantages of the embodiments shown in FIG. 9, and indeed of other described embodiments are that the output signal exhibits good tolerance to power supply fluctuations, temperature fluctuations, etc. The output signal is also highly tolerant of process variation, as the absolute frequency of even the second oscillator is not important. It is preferable, however, that components within the integrated circuit employed in embodiments of the invention should be as matched as possible. The circuits are also tunable via external passive devices for any desired application.

Still referring to FIG. 9, the output signal generating circuitry 4 comprises a clock divider 42 which is arranged to receive the oscillating output signal 10 of the first oscillator 1 and generate a corresponding further oscillating output signal 420. The output signal of the first oscillator 1 for a first value of sensed temperature is indicated on the figure as 10a. The corresponding divided output signal from the clock divider 42 is indicated as 420a. If temperature then increases, this increases the resistance of first component 11 of the first oscillator circuit, which in turn reduces the output frequency of its output signal 10. That output signal, at the increased temperature, is indicated as 10b, with the corresponding clock divider output signal being indicated as 420b. The output frequency of the second oscillator circuit 2 is substantially unaltered by the change in temperature sensed by the sensor, and its output signal is indicated by 20 in the figure. Thus, as temperature to which the sensor is exposed increases, the period of the first oscillator output signal 10, and hence of the clock divider output signal 420 increases. The counter circuit 41 is enabled while the divided output signal 420 is high. Thus, the counter counts the number of cycles of the second oscillator output signal 20 in half of one cycle of the divided output signal 420. As temperature increases, that period of the divided output signal 420 increases (as shown by 420*b*) and hence the counter output 40 increases (from 40*a* to 40*b*).

Figure 10:
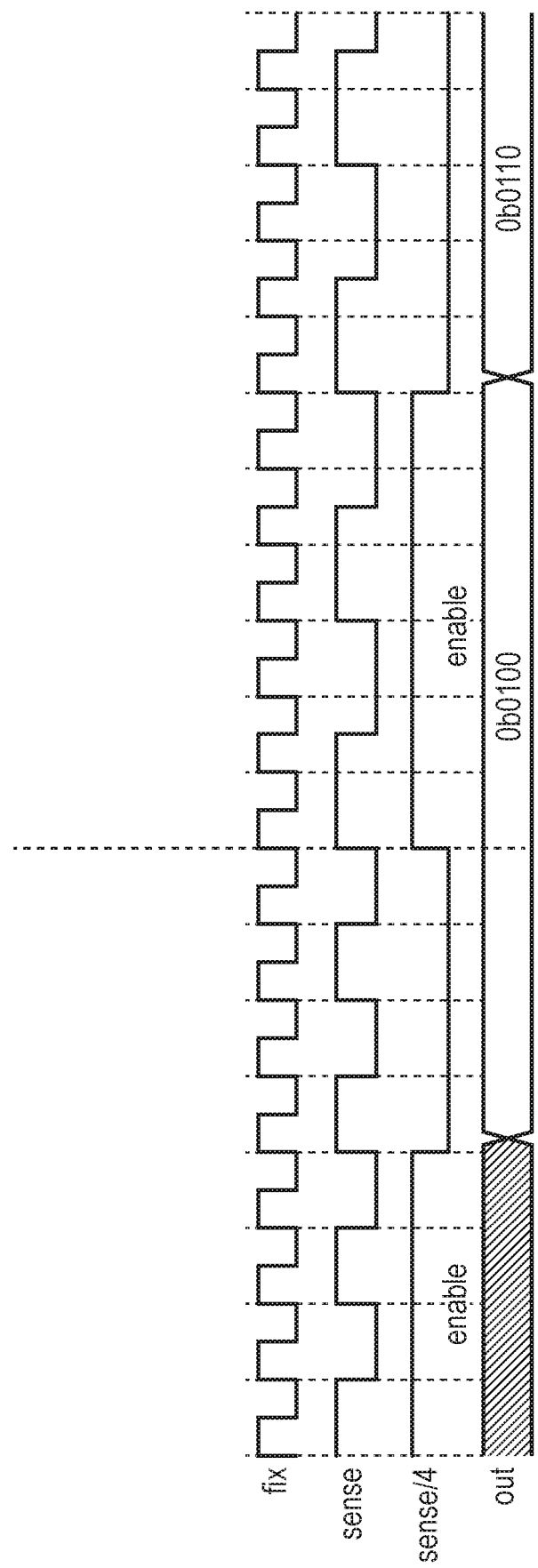
FIG. 10 illustrates signals generated by the apparatus of FIG. 9.

Referring now to FIG. 10, this illustrates the operation of a simplified example generally in accordance with the apparatus illustrated in FIG. 9. The two oscillator output signals are shown, together with the divided down output signal and first output signal 42 are shown for two conditions. In the left half of the figure, the sensor capacitance is two times the nominal value of the capacitance of the corresponding component in the "fixed" oscillator. Thus, the "sensor" oscillator has two times the time period of the fixed oscillator. The sensor oscillator frequency is divided down by a factor of four by a clock divider. The "fixed" oscillator pulses four times while the divided oscillator's signal is high and the counter is enabled. The output is clocked out when the divided down output signal from the clock divider falls. The output from the counter circuit is then four.

The right-hand side of FIG. 10 illustrates a different condition, where the sensor capacitance is three times the nominal value of the capacitance in the "fixed" oscillator. Thus, the sensor oscillator has three times the time period of the fixed oscillator. Again, the sensor frequency is divided by down by a factor of four by the clock divider. Then, the fixed oscillator pulses six times whilst the divided down output signal is high and the counter is enabled. The output is clocked out when the divided down signal falls, and hence the output of the counter circuit is now six.

It will be appreciated that the clock divider used in certain embodiments of the invention, such as that shown in FIG. 9, increases the ratio between the fixed and sense oscillator time periods by a known factor. This has the effect of increasing the resolution, i.e. the minimum time unit that the time period of the sense oscillator can be resolved to, which in turn corresponds to the minimum change in sensor parameter that can be detected.

In particular, resolution (in seconds)=$T_{FIX}/(0.5 \times DF)$.

Where $T_{FIX}$=time period of fixed oscillator in seconds and DF=division factor (i.e. five stage divider has DF=$2^5$=32.

The transfer function for the circuit is as follows:

$$\text{Output count}=(T_{SENSE} \times 0.5 \times DF)/T_{FIX}$$

The time period for the oscillators, for a given supply voltage, is given as: T=kRC Where R=resistance in ohms used to define the oscillator period (this could be from the sensor)

C=capacitance in farads used to define oscillator period (this could be from the sensor); and k=a constant value (for a given supply voltage) dependent on transistor characteristics.

Figure 11:
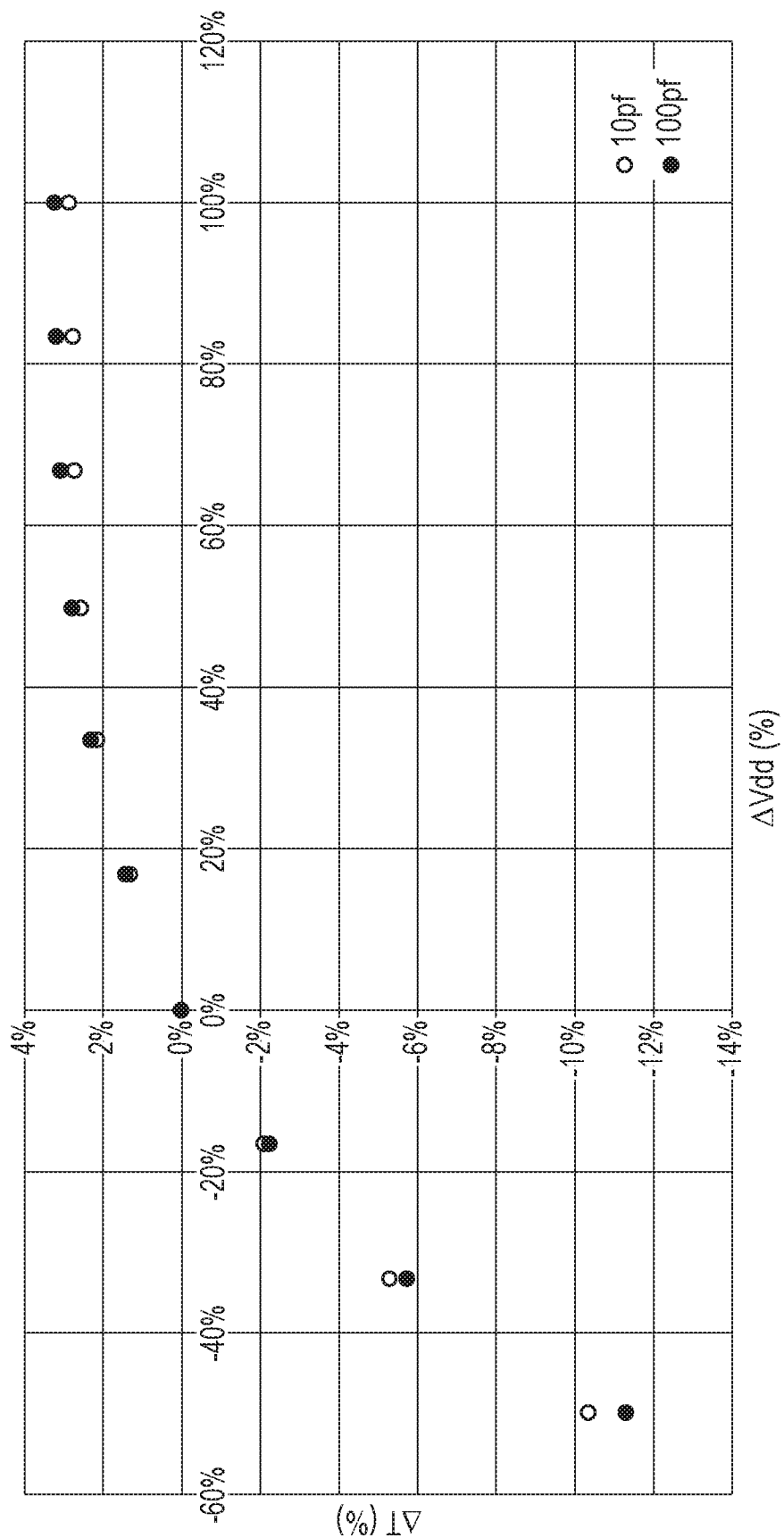
FIG. 11 illustrates the change in oscillator output signal period with supply voltage in certain embodiments of the invention.

Referring now to FIG. 11, this illustrates the change in period of the oscillating output signal of an RC oscillator used in embodiments of the invention as a function of supply voltage, for two different values of the capacitive timing component.

Figure 12:
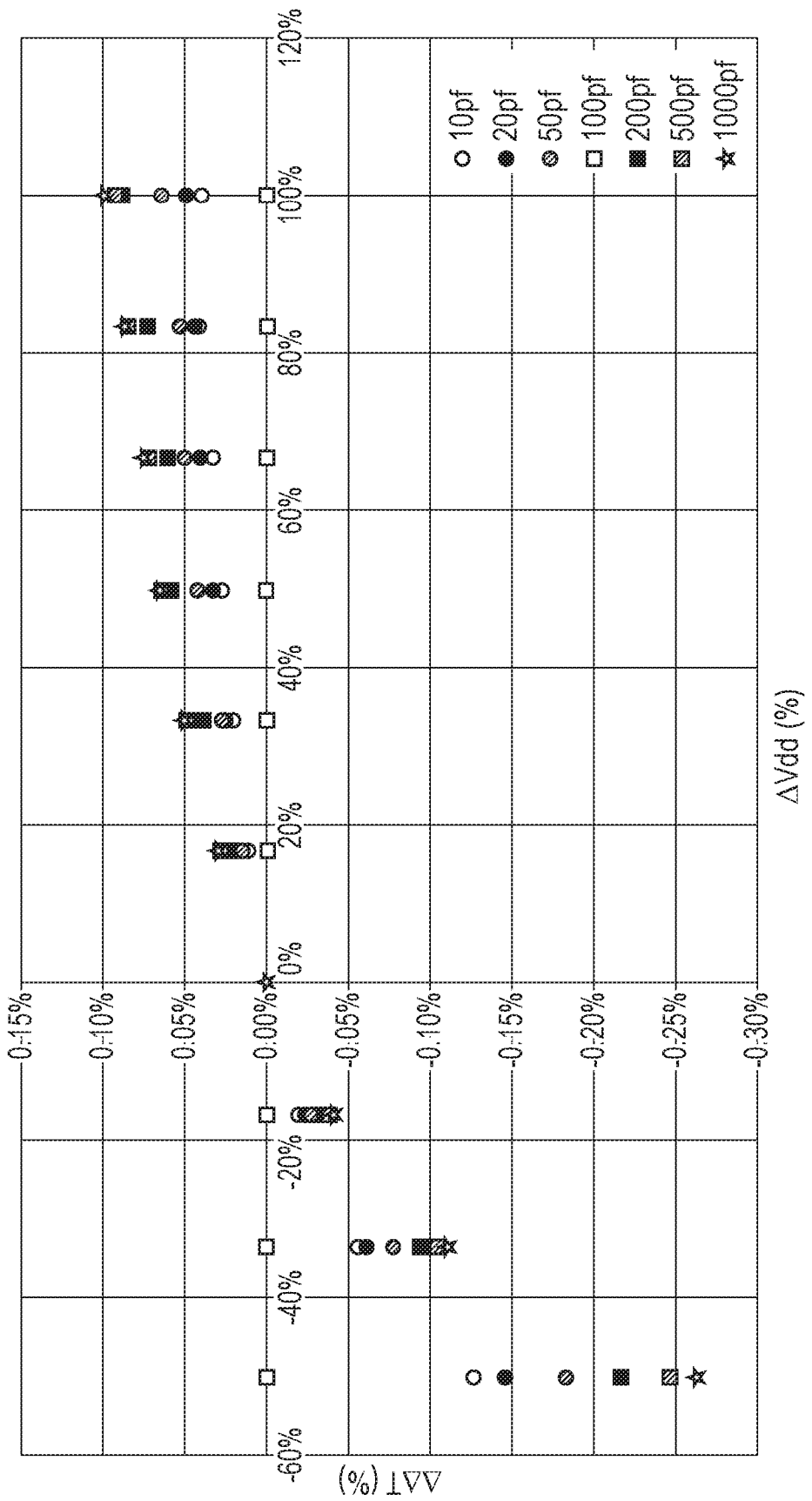
FIG. 12 illustrates the change in output signal period of two RC oscillators as a result of the change in supply voltage in an embodiment of the invention.

Referring now to FIG. 12, this illustrates the small difference in the change in period of two RC oscillators (fixed and sense) due to change in supply voltage in embodiments of the invention where nominally identical oscillators are used, for example implemented on a common integrated circuit, with the exception of just one of the respective timing components.

It will be appreciated that advantages provided by certain embodiments of the invention include: good common mode rejection ratio and power supply rejection ratio; the use of a comparator; amplifier, or other complex circuitry may be avoided; the circuit may rapidly convert from analog to digital, and minimise noise; the measurement apparatus may interface directly with a sensor, and may not require additional circuitry; the apparatus may have low complexity.

Figure 13:
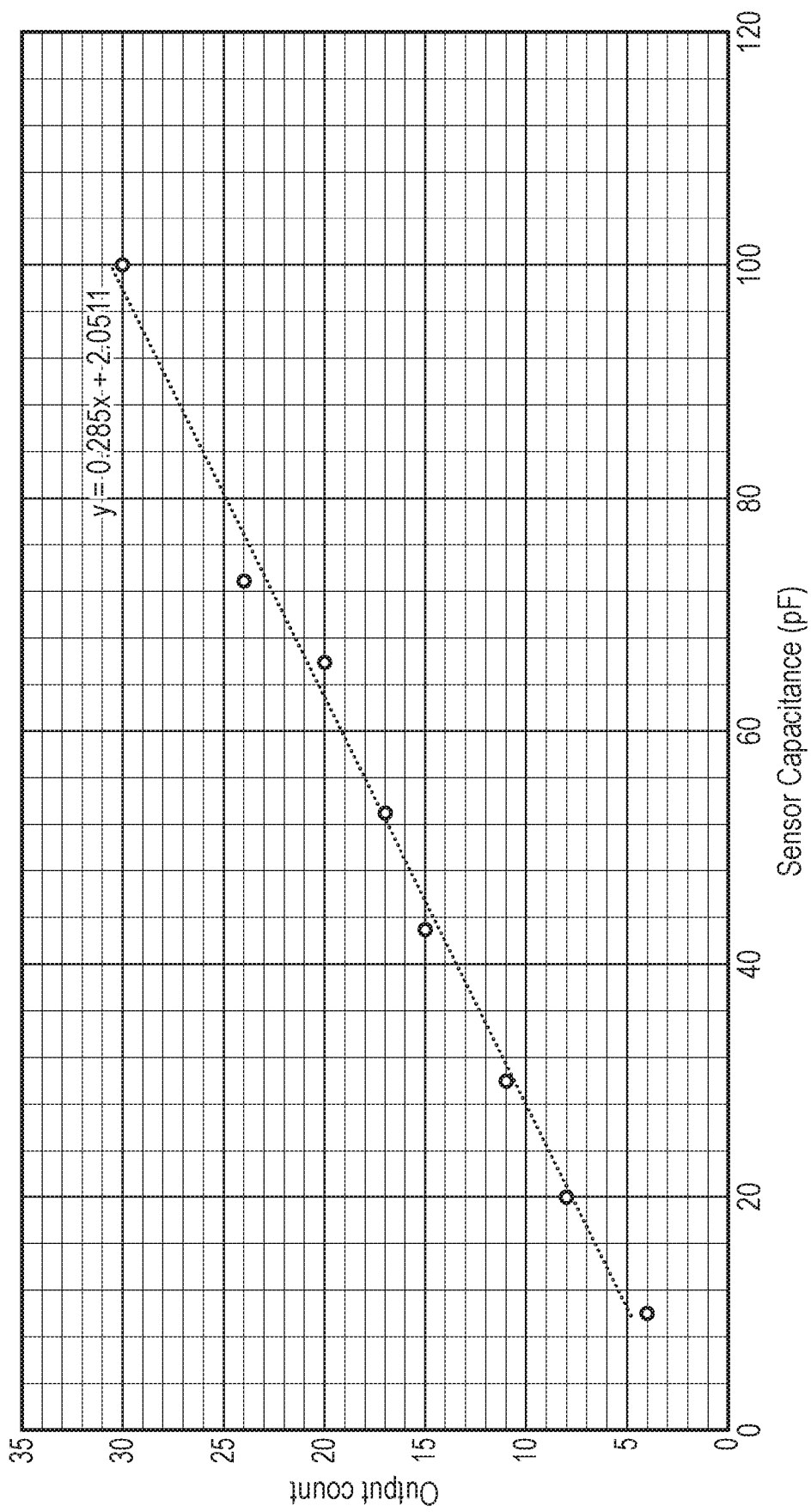
FIG. 13 illustrates the output signal of an embodiment of the invention as a function of sensor capacitance.

Referring now to FIG. 13, this illustrates the dependence of output signal (in the form of an output count) from measurement apparatus embodying the invention as a function of change in capacitance of a capacitive first timing component of the first oscillator circuit. As can be seen, the output count signal is substantially proportional to sensor capacitance.

It will be appreciated that certain embodiments of the invention provide measurement apparatus which is able to convert/measure the changing resistance or capacitance of a sensor to a digital output signal with improved immunity to power and environmental changes. The change in resistance or capacitance of the sensor element (which is a timing component of one of the oscillator circuits) results in a proportional change in frequency of an internal RC based oscillator. The frequency of this oscillator is sampled by a second oscillator using fixed RC values in certain embodiments. Both oscillators are constructed using the same architecture in certain embodiments, resulting in improved immunity to environmental changes such as temperature and power fluctuations compared with voltage comparison based ADC circuits. The two oscillators in certain embodiments will be affected in a similar way by environmental changes, such that the ratio of their frequencies remains stable and therefore the output will remain stable. In certain embodiments, substantially identical nominal frequencies and timing component values are used for both oscillators, with the sensing oscillator frequency passing through a series of frequency divider stages before being sampled. The sampling occurs via a digital counter which resets on each cycle of the sensing oscillator.

It will be appreciated in certain embodiments the output signal of the first oscillator circuit is used to determine a time period in which cycles of the second oscillator output signal are counted. In alternative embodiments, it is the output signal of the second oscillator that is used to determine a time period in which cycles of the first oscillator output signal are counted.

It will be appreciated that further advantages of certain embodiments of the invention are that, by employing nominally identical oscillators in the measurement apparatus, immunity to voltage and other environmental changes outside the sensing mode is achieved. In certain embodiments, the measurement apparatus is arranged to generate an output signal indicative of humidity to which the sensor is exposed. In such embodiments, the sensing element may be a capacitor of the first oscillator circuit.

The implementation of the measurement apparatus using two oscillators provides the advantage that a stable power supply is not required, and certain embodiments are particularly suited to implementation in NFC chips.

Although examples described above have employed RC oscillator circuits other forms of oscillator circuits may be employed in alternative embodiments of the invention. For example, the oscillators may be LC oscillators, or any other form of oscillator which incorporates at least one timing component having a property determining, at least in part, an output frequency of the circuit that property being dependent at least to some degree on the physical quantity to be measured.

Referring again to FIG. 7, this illustrates part of measurement apparatus incorporating a sensor varying in resistance, and FIG. 8 illustrates an alternative embodiment incorporating a sensor varying in capacitance. In both cases, the varying oscillator may be tuned using optional external (discrete) and/or internal components, any of which may be in parallel and/or series with the varying sensor component. The optional component type will be dictated by the varying sensor component (resistance or capacitance). Referring again to FIG. 7, this also illustrates optional tuning components 21e and 21f which may be incorporated on-chip in the second oscillator 2.

In certain embodiments, each of the oscillator circuits may be a multiple invertor RC oscillator for stability.

In certain embodiments, the on-chip timing resistor for the "static" oscillator may have a thermal co-efficient of resistance but acts in opposition to the varying resistance of the sensor, to enhance the sensitivity of the technique. Calibration may take account of this non-static behaviour of the static oscillator. A similar approach may be adopted for a varying sensor capacitor and its partner on-chip static timing capacitor.

In certain embodiments, the "static" oscillator frequency (i.e. the second oscillator frequency) and nominal varying oscillator frequency (i.e. the first oscillator frequency) may be designed to be essentially equal, or one may be designed to be a fraction of the other; in the latter case a clock divider may not be required, simplifying the circuit.

It will be appreciated that other oscillator architectures, for which the timing is dependent on the resistive or capacitive component, or some other component, may be utilised in alternative embodiments of the invention.

In certain embodiments, all of the oscillator components are provided on-chip, except for the variable sensor component. In some circumstances, one might wish to compensate or scale the sensor component's response with other discrete components, and these may be incorporated in alternative embodiments of the invention.

It will be appreciated that certain embodiments of the invention incorporate all of the components of the first and second oscillator circuits (with the exception of the one or more first components located in the sensor) and the components of the output signal generating circuitry on a single chip, thereby linking variations in the output frequencies of the first and second oscillators in response to fluctuations against supply voltage and/or external parameters as closely as possible. In other embodiments the sensor is a part of the same chip, and therefore all of the components of the first and second oscillator circuits are on the same chip. This may be enabled, for example, by employing timing components (e.g. resistors, capacitors) having dissimilar sensitivities to the measurand in the respective oscillator circuits.

By utilising identical, or near-identical oscillator circuits, certain embodiments of the invention are able to provide accurate output signals, which are independent of changes in supply voltage and/or other external parameters, without requiring the output frequency of the second oscillator to be highly stable or accurate. Generally speaking, in certain embodiments, the first and second oscillators are arranged such that their output frequencies drift in substantially the same manner in response to power supply and/or common environmental changes. In certain embodiments, the measurement apparatus, either including or except for the sensor, may be implemented on a single integrated circuit, which may be flexible. In certain embodiments, the integrated circuit may be comprised within a tag, such as an NFC tag.

Throughout the description and claims of this specification, the words "comprise" and "contain" and variations of them mean "including but not limited to", and they are not intended to (and do not) exclude other moieties, additives, components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics, compounds, chemical moieties or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The reader's attention is directed to all papers and documents which are filed concurrently with or previous to this specification in connection with this application and which are open to public inspection with this specification, and the contents of all such papers and documents are incorporated herein by reference.

The invention claimed is:

1. A measurement apparatus comprising:
a first oscillator circuit and a second oscillator circuit, each oscillator circuit being arranged to generate a respective oscillating output signal and comprising at least a respective first component having a property determining a respective output frequency of the respective oscillating output signal;
a sensor configured to sense a measurand, the sensor comprising said first component of the first oscillator circuit, said property of said first component of the first oscillator circuit being dependent upon said measurand; and
circuitry arranged to receive said oscillating output signals and generate a first output signal, said first output signal being indicative of a number of cycles of one of the first and second oscillating output signals in a time period determined by a period of the other of said first and second oscillating output signals, wherein said circuitry comprises divider circuitry arranged to receive one of said oscillating output signals and generate a further output signal oscillating at a fraction of the frequency of said received one of the oscillating output signals.

2. The apparatus in accordance with claim 1, wherein said property of said first component of the second oscillator circuit is dependent upon said measurand.

3. The apparatus in accordance with claim 2, wherein said property of said first component of the first oscillator circuit and said property of said first component of the second oscillator circuit have substantially the same dependence upon said measurand.

4. The apparatus in accordance with claim 2, wherein the dependence of said property of said first component of the first oscillator circuit upon said measurand is different from the dependence of said property of said first component of the second oscillator circuit upon said measurand over at least a range of values of said measurand.

5. The apparatus in accordance with claim 1, wherein said property of said first component of the second oscillator is independent of said measurand.

6. The apparatus in accordance with claim 1, wherein each oscillator circuit comprises a respective second component having a property determining said respective output frequency.

7. The apparatus in accordance with claim 1, wherein each oscillator circuit comprises at least a respective first inverter.

8. The apparatus in accordance with claim 1, wherein the first and second oscillator circuits are arranged such that their oscillating output signals have the same frequency for a value of said measurand.

9. The apparatus in accordance with claim 1, wherein the first and second oscillators are arranged such that their oscillating output signals have different frequencies over a range of values of the measurand.

10. A measurement apparatus comprising:
a first oscillator circuit and a second oscillator circuit, each oscillator circuit being arranged to generate a respective oscillating output signal and comprising at least a respective first component having a property determining a respective output frequency of the respective oscillating output signal;
a sensor configured to sense a measurand the sensor comprising said first component of the first oscillator circuit, said property of said first component of the first oscillator circuit being dependent upon said measurand; and
circuitry arranged to receive said oscillating output signals and generate a first output signal, said first output signal being indicative of a number of cycles of one of the first and second oscillating output signals in a time period determined by a period of the other of said first and second oscillating output signals, wherein the first and second oscillators are arranged such that their oscillating output signals have different frequencies over a range of values of the measurand, and wherein said circuitry comprises no frequency divider circuitry arranged to receive one of said oscillating output signals and generate a further output signal oscillating at a fraction of the frequency of said received one of the oscillating output signals.

11. The apparatus in accordance with claim 1, wherein the divider circuitry is arranged to receive the oscillating output signal of the first oscillator circuit.

12. The apparatus in accordance with claim 11, wherein said circuitry arranged to receive said oscillating output signals is arranged such that said first output signal indicates a number of cycles of the oscillating output signal of the second oscillator circuit in one period, or in half of one period, of the oscillating further output signal.

13. The apparatus in accordance with claim 1, further comprising power supply circuitry arranged to power the first and second oscillator circuits and said circuitry arranged to receive said oscillating output signals.

14. The apparatus in accordance with claim 13, wherein said power supply circuitry is arranged to generate a supply voltage between first and second supply rails, the first and second oscillator circuits being coupled to said supply rails.

15. The apparatus in accordance with claim 14, wherein said power supply circuitry comprises at least one antenna for receiving power wirelessly, and is arranged to generate said supply voltage from power received wirelessly by said at least one antenna.

16. The apparatus in accordance with claim 1, comprising an integrated circuit coupled to said sensor.

17. A measurement apparatus comprising:
a first oscillator circuit and a second oscillator circuit, each oscillator circuit being arranged to generate a respective oscillating output signal and comprising at least a respective first component having a property determining a respective output frequency of the respective oscillating output signal;
a sensor configured to sense a measurand the sensor comprising said first component of the first oscillator circuit, said property of said first component of the first oscillator circuit being dependent upon said measurand, and
circuitry arranged to receive said oscillating output signals and generate a first output signal, said first output signal being indicative of a number of cycles of one of the first and second oscillating output signals in a time period determined by a period of the other of said first and second oscillating output signals, wherein said integrated circuit comprises said circuitry arranged to receive said oscillating output signals.

18. The apparatus in accordance with claim 16, wherein said integrated circuit comprises said first component of the second oscillator.

19. A measurement apparatus comprising:
a first oscillator circuit and a second oscillator circuit, each oscillator circuit being arranged to generate a respective oscillating output signal and comprising at least a respective first component having a property determining a respective output frequency of the respective oscillating output signal;
a sensor configured to sense a measurand, the sensor comprising said first component of the first oscillator circuit, said property of said first component of the first oscillator circuit being dependent upon said measurand; and
circuitry arranged to receive said oscillating output signals and generate a first output signal, said first output signal being indicative of a number of cycles of one of the first and second oscillating output signals in a time period determined by a period of the other of said first and second oscillating output signals, further comprising a housing arranged to isolate, at least partially, the first component of the second oscillator circuit from said measurand.

20. The apparatus in accordance with claim 1, wherein the sensor comprises said first component of the second oscillator circuit.

21. The apparatus in accordance with claim 1, wherein each of the first and second oscillator circuits is an RC oscillator circuit.

22. The apparatus in accordance with claim 21, wherein each said first component is a resistor and said property of the first component is resistance.

23. The apparatus in accordance with claim 21, wherein each said first component is a capacitor, and said property of the first component is capacitance.

24. A measurement apparatus comprising:
a first oscillator circuit and a second oscillator circuit, each oscillator circuit being arranged to generate a respective oscillating output signal and comprising at least a respective first component having a property determining a respective output frequency of the respective oscillating output signal;

a sensor configured to sense a measurand, the sensor comprising said first component of the first oscillator circuit, said property of said first component of the first oscillator circuit being dependent upon said measurand; and circuitry arranged to receive said oscillating output signals and generate a first output signal, said first output signal being indicative of a number of cycles of one of the first and second oscillating output signals in a time period determined by a period of the other of said first and second oscillating output signals, wherein each of the first and second oscillator circuits is an LC oscillator circuit.

* * * * *